(12) United States Patent
Nightingale et al.

(10) Patent No.: US 7,366,650 B2
(45) Date of Patent: Apr. 29, 2008

(54) SOFTWARE AND HARDWARE SIMULATION

(75) Inventors: Andrew Mark Nightingale, Cambridge (GB); Alistair Crone Bruce, Stockport (GB)

(73) Assignee: ARM Limited, Cambridge (GB)

( * ) Notice: Subject to any disclaimer, the term of this patent is extended or adjusted under 35 U.S.C. 154(b) by 1284 days.

(21) Appl. No.: 10/079,811

(22) Filed: Feb. 22, 2002

(65) Prior Publication Data
US 2002/0152456 A1 Oct. 17, 2002

(30) Foreign Application Priority Data

Apr. 12, 2001 (GB) ................................ 0109282.4
Aug. 14, 2001 (GB) ................................ 0119849.8

(51) Int. Cl.
| G06F 17/50 | (2006.01) |
| G06F 9/44 | (2006.01) |
| G06F 9/455 | (2006.01) |
| G01V 19/00 | (2006.01) |

(52) U.S. Cl. ............................. 703/26; 703/13; 703/20; 702/2; 702/14; 702/28; 702/118; 716/4; 716/5; 716/18; 714/739

(58) Field of Classification Search ................. 703/26, 703/13, 20; 702/2, 4, 28, 118; 714/739; 716/4, 5, 18
See application file for complete search history.

(56) References Cited

U.S. PATENT DOCUMENTS

| 5,546,562 | A | * | 8/1996 | Patel ............................ 703/14 |
| 5,835,764 | A | * | 11/1998 | Platt et al. .................. 718/101 |
| 5,870,588 | A | * | 2/1999 | Rompaey et al. ............. 703/13 |
| 5,960,182 | A | * | 9/1999 | Matsuoka et al. ............ 703/17 |
| 6,052,524 | A | * | 4/2000 | Pauna .......................... 703/22 |
| 6,182,258 | B1 | * | 1/2001 | Hollander .................... 714/739 |
| 6,202,044 | B1 | * | 3/2001 | Tzori ........................... 703/28 |
| 6,209,120 | B1 | * | 3/2001 | Kurshan et al. ................ 716/5 |
| 6,279,146 | B1 | * | 8/2001 | Evans et al. .................. 716/18 |
| 6,408,009 | B1 | * | 6/2002 | Campbell et al. ........... 370/461 |
| 6,470,481 | B2 | * | 10/2002 | Brouhard et al. .............. 716/5 |
| 6,490,545 | B1 | * | 12/2002 | Peng ........................... 703/13 |
| 6,530,054 | B2 | * | 3/2003 | Hollander .................... 714/739 |

(Continued)

FOREIGN PATENT DOCUMENTS

JP 1-112344 5/1989

(Continued)

OTHER PUBLICATIONS

Xiao-Dong et al, "Implementation of Co-Verification Environment for Embedded System" *Journal of Computer Aided Design and Computer Graphics*, vol. 12, No. 10, Oct. 2000, pp. 736-739.

(Continued)

*Primary Examiner*—Kamini Shah
*Assistant Examiner*—Shambhavi Patel
(74) *Attorney, Agent, or Firm*—Nixon & Vanderhye P.C.

(57) ABSTRACT

A verification environment is provided that co-verifies a software component 8 and a hardware component 10. Within the same environment using a common test controller 18 both hardware stimuli and software stimuli may be applied to their respective simulators. The response of both the software and the hardware to the simulation conducted can be monitored to check for proper operation.

16 Claims, 9 Drawing Sheets

U.S. PATENT DOCUMENTS

| | | | |
|---|---|---|---|
| 6,565,502 B1 * | 5/2003 | Bede et al. | 600/7 |
| 6,766,284 B2 * | 7/2004 | Finch | 703/20 |
| 6,810,373 B1 * | 10/2004 | Harmon et al. | 703/14 |

FOREIGN PATENT DOCUMENTS

| | | |
|---|---|---|
| JP | 2000-259445 | 9/2000 |

OTHER PUBLICATIONS

D. Nadamuni, "Co-Verification Tools: A Market Focus" *Embedded Systems Programming*, vol. 12, No. 9, Sep. 1999, pp. 119-122.

www.mentor.com "Core Based SoC Design System Verification Challenges", 1999.

"Architecture for a Distribution Computing Environment Test Application—Harmonic" *IBM Technical Disclosure Bulletin*, vol. 39, No. 6, Jun. 1996, pp. 259-261.

A. Ghosh et al, "A Hardware-Software Co-Simulator for Embedded System Design and Debugging" *IFIP International Conference on Computer Hardware Description Languages and their Applications*, Aug./Sep. 1995, pp. 155-164.

H. Kawakita, "Scalable Design Scheme at System On-Chip Age, Final Round, Real-Time Built-in System Verification Method" Interface, vol. 24, No. 2, Feb. 1998, pp. 213-219.

N. Koyama et al, "Testing Phase Improvement by Using OS Simulation Technique in Reactive Program Development" IPPV Study Report, vol. 98, No. 64 (SE-120), Jul. 1998, pp. 93-100.

* cited by examiner

SOFTWARE AND HARDWARE SIMULATION

BACKGROUND OF THE INVENTION

1. Field of the Invention

This invention relates to the field of data processing systems. More particularly, this invention relates to the simulation of data processing systems including both a software component and a hardware component.

2. Description of the Prior Art

It is widely recognized that verification can take up to 70% of the development effort for a system on a chip (SoC) design. This includes software as well as hardware verification.

Most hardware verification is done by simulation, however, until recently, efficient software verification has had to wait for the hardware design to finish and be synthesized onto a field programmable gate array (FPGA). Then the software could be run on a prototype development board, but this wait inevitably increased the development time.

One solution is to simulate the software and the hardware parts together using commercial co-simulators. One notable benefit of this approach is the quality of the software component is much improved as the co-verification has eliminated errors that would otherwise only be found during system integration.

IP blocks are self-contained designs for common functions that can be re-used in a SoC, saving time and effort for the main function. During their development, verification can be done in the same way as for a full SoC and with the same benefits. However, an IP block is intended for re-use and so its verification should also be reuseable. In fact, an IP block is only viable if it takes less effort to integrate into a system than it would to develop the block from scratch.

Under these circumstances it is to be expected that nearly all the integration effort will be in verification. It has been suggested that verification represents up to 90% of the effort to integrate an IP block into a system.

An IP block should therefore be considered as having three components: hardware, software and verification. Reuseable verification is an important part of an IP block as it enhances its value by reducing the system integration effort. In other words, the value of the hardware and software are the reason for using an IP block but the verification component makes their re-use possible.

From this, it follows that the verification supplied with an IP block should be aimed at the needs of integration, not just development. Because IP blocks tend to be used as supplied, with no changes apart from those required by integration, functional verification of the block is less important. That has already been done during its development. Rather, the verification should be designed to show that the rest of the system correctly supports the IP block and that its presence does not upset the other parts of the design. This is very different from the standalone verification often supplied to verify synthesis of a soft IP block. Currently, the verification component supplies a kit of verification parts that can be used to build a set of verification tests as part of a system validation plan.

The latest verification techniques make use of high-level verification languages (HVL) supported by tools such as Veristy's Specman Elite or Synopsis'Vera. These provide good links to hardware simulation environments. Their purpose built test vector generation and coverage analysis tools make verification much easier and more thorough.

These tools have now added facilities to allow for the simulation of embedded software running on a SoC design.

SUMMARY OF THE INVENTION

Viewed from one aspect the present invention provides a method of simulating a system having a software component and a hardware component, said method comprising the steps of:

(i) generating with a test controller a software stimulus for said software component and a hardware stimulus for said hardware component, said software stimulus and said hardware stimulus being associated so as to permit verification of correct interaction of said software component and said hardware component;

(ii) modelling operation of said software component in response to said software stimulus using a software simulator; and (iii) modelling operation of said hardware component in response to said hardware stimulus using a hardware stimulator; wherein (iv) said hardware simulator and said software simulator are linked to model interaction between said hardware component and said software component; and (v) said software stimulus is passed to said software simulator by issuing a remote procedure call from said test controller to said software simulator.

The invention recognises that in many circumstances it is highly desirable to co-verify the correct operation and interaction of a software component and a hardware component of a design, such as, for example, the hardware design of a peripheral circuit and the associated peripheral driver software. Providing the ability to test in a simulated form the software component and the hardware component together enables more rapid product development since there is no longer a need to wait until test physical hardware becomes available before the interaction between the software component and the hardware component can be verified. Measures that reduce the time taken to develop new products are highly advantageous and give rise to strong competitive advantages. The ability to test the hardware component and the software component interacting together is facilitated by providing a remote procedure call mechanism whereby the test controller can pass a software stimulus to the software simulation. The remote procedure call mechanism for stimulating the software simulator allows the software component to be driven from the test controller which is already controlling the hardware simulation stimulation in a manner that avoids the need to develop specific test programs to be simulated by the software simulator for each design to be tested. Furthermore, providing the test controller with the ability to stimulate both the software simulator and the hardware simulator allows the test controller to closely monitor the interaction between the software component and the hardware component in a manner that strongly supports the ability to verify correct operation and interaction of the two components.

In preferred embodiments of the invention communication between the test controller and the software simulator is facilitated by the use of a shared memory via which call data specifying a software stimulus may be passed between the test controller and the software simulator. In this context, preferred embodiments utilise a start flag which may be set by the test controller within the shared memory to indicate to the software simulator that there is a pending software stimulus. The software simulator may correspondingly reset the start flag when it has completed modelling of the software stimulus.

The data written within the shared memory advantageously includes data identifying a software routine to be modelled within the software component and variable data to be used in responding to the software stimulus.

Whilst it will be appreciated that the above described technique can be utilised to test the correct operation of a wide variety of software components and hardware components that are associated in a manner such that their co-verification is desirable, the invention is particularly well suited to the co-verification of hardware peripheral devices and their associated software drivers. It will often be the case that these associated hardware and software components will be supplied together and will be unchanged between a wide variety of designs with the result that their rapid co-verification and removal from the design testing needs of a project is strongly desirable.

Preferred embodiments of the invention also provide for the monitoring of modelled signals at an interface with the hardware component that are generated in response to stimulation of the software component and the hardware component.

In this way, whilst the modelling and testing of the software component and the hardware component can effectively be bundled together into single process, the ability is maintained to monitor modelled signals at the hardware interface of the hardware component, so as, for example, to ensure that they obey predetermined rules.

The utilisation of a test controller to apply both software stimuli and hardware stimuli enables the coverage tools associated with such test controllers to be extended in use to ensure that an appropriate range of software stimuli have been applied in order to increase confidence in the testing that is performed.

As well as applying hardware stimuli to the hardware component, the test controller can operate to monitor the hardware to ensure that proper responses within the hardware are observed when corresponding software stimuli are applied. Thus, as an example, a software stimulus may be applied in the form of an instruction writing a particular value to a register within the hardware component and the hardware component can be monitored to ensure that physical signals corresponding to the value do appear within the appropriate register. The provision of a mechanism whereby a test controller can apply both software stimuli and hardware stimuli and monitor the resulting state changes to ensure that they match what is expected is strongly advantageous.

Viewed from another aspect the present invention provides apparatus for simulating a system having a software component and a hardware component, said apparatus comprising:

(i) a test controller operable to generate a software stimulus for said software component and a hardware stimulus for said hardware component, said software stimulus and said hardware stimulus being associated so as to permit verification of correct interaction of said software component and said hardware component;

(ii) a software simulator operable to model operation of said software component in response to said software stimulus; and (iii) a hardware simulator operable to model operation of said hardware component in response to said hardware stimulus; wherein (iv) said hardware simulator and said software simulator are linked to model interaction between said hardware component and said software component; and (v) said software stimulus is passed to said software simulator by issuing a remote procedure call from said test controller to said software simulator.

Viewed from a further aspect the present invention provides a computer program product for controlling a computer to simulate a system having a software component and a hardware component, said computer program product comprising:

(i) test controller logic operable to generate a software stimulus for said software component and a hardware stimulus for said hardware component, said software stimulus and said hardware stimulus being associated so as to permit verification of correct interaction of said software component and said hardware component;

(ii) software simulator logic operable to model operation of said software component in response to said software stimulus; and (iii) hardware simulator logic operable to model operation of said hardware component in response to said hardware stimulus; wherein (iv) said hardware simulator logic and said software simulator logic are linked to model interaction between said hardware component and said software component; and (v) said software stimulus is passed to said software simulator logic by issuing a remote procedure call from said test controller logic to said software simulator logic.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
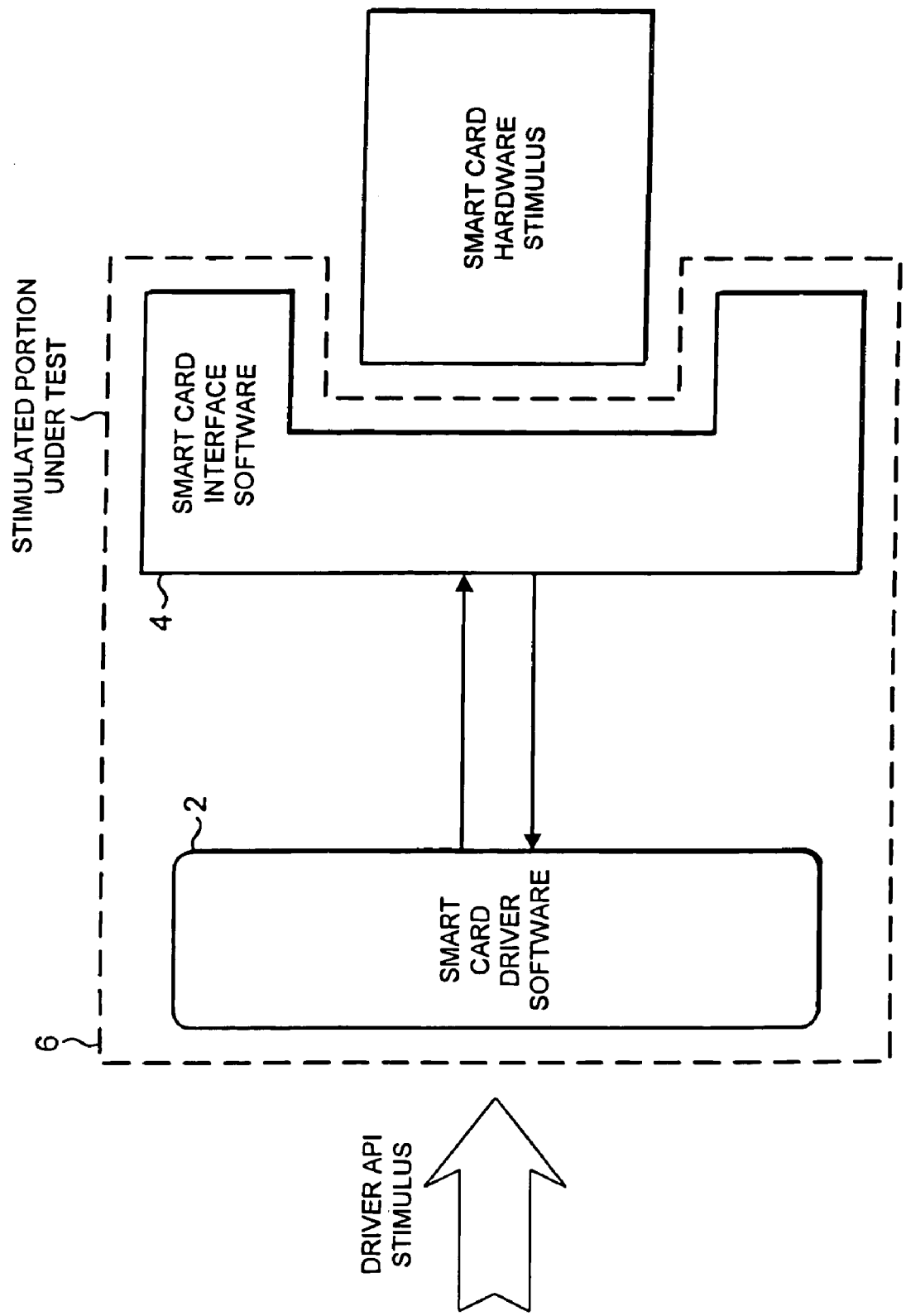
FIG. 1 schematically illustrates a software component and a hardware component to be simulated together.

FIG. 1 illustrates a software component in the form of a smartcard driver 2 that serves to interact with a hardware component in the form of a smartcard interface 4. In practice both the smartcard driver 2 and the smartcard interface 4 may be provided as IP blocks by an organisation other than the user of those blocks in this instance. The smartcard driver 2 and the smartcard interface 4 will provide a small part of a larger SoC design. As well as providing the smartcard driver code and the data defining the smartcard interface circuit, such as integrated circuit layout defining data, the provider of these IP blocks may also provide a simulation of the smartcard interface 4 and the smartcard driver 2, or at least data that allows for their simulation. As illustrated, the smartcard driver 2 and the smartcard interface 4 can be considered together as a portion under test 6 which is supplied to a customer and which the customer wishes to test within their own design. In order to test the portion under test 6, the customer will apply software stimuli to the smartcard driver 2 in the form of software instructions at the driver API. Similarly, in order to test the smartcard interface 4, the customer will provide appropriate test stimuli that can be supplied to the model of the smartcard interface.

In practice, the software stimuli applied to the smartcard driver 2 may represent calls from an application program or calls from an associated operating system within the system as a whole that is being developed. The hardware stimuli may represent real physical signals that can be applied to the smartcard interface 4, such as signals that would result from insertion of a physical smartcard into such an interface in use, interrupt signals and other external signals.

It will be appreciated that by providing the portion under test 6 in a form that may be simulated as a whole, the customer need not wait until physical hardware is available before they can verify the correct operation of the smartcard driver 2 with the smartcard interface 4 within their overall system. There may well be large amounts of other testing that still needs to be performed, but the task of verifying the correct interaction of the smartcard driver 2 and the smartcard interface 4 can be pushed earlier into the development process in a manner that speeds overall development time.

Figure 2:
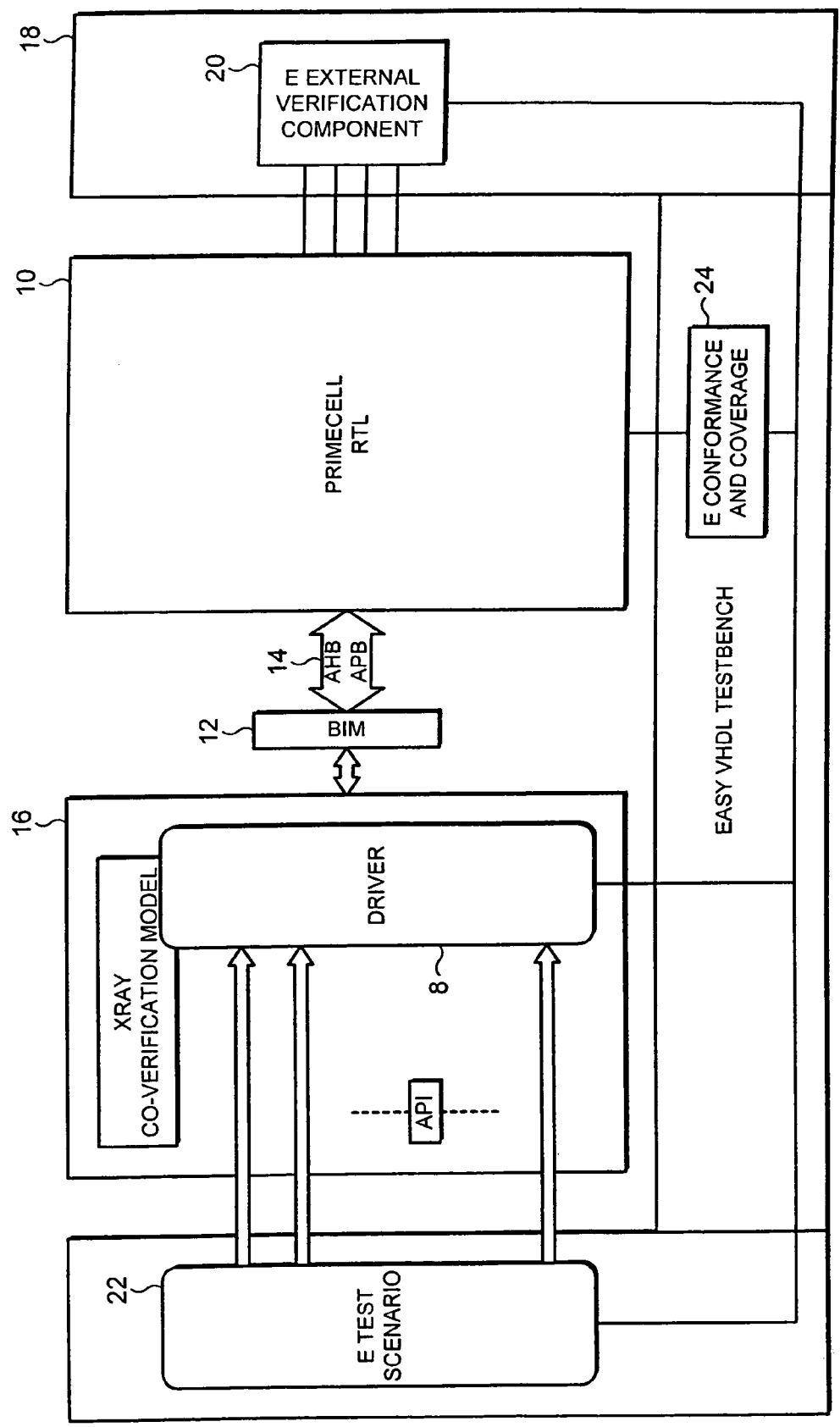
FIG. 2 schematically illustrates a co-verification environment for co-verifying a software component and a hardware component.

FIG. 2 schematically illustrates a test environment. A software driver 8 and a corresponding hardware peripheral device 10, represented by RTL data that may be used to control a simulator, are both provided. A bus interface module 12 handles the mapping of the response to software instruction execution into appropriate physical signals upon the peripheral bus 14 for passing to the hardware peripheral device 10. The bus interface module 12 will typically be a re-usable entity within the system that can be employed with a wide variety of software being simulated and hardware components that are to be driven and responded to.

The driver software 8 is simulated within an instruction set simulator 16. Software stimuli are passed to the software driver 8 via its API.

The hardware peripheral device 10 may be simulated using known hardware simulation techniques. The RTL data defining the hardware peripheral device 10 defines the hardware device to be simulated to the simulation software.

A test controller 18 is shown surrounding the instruction set simulator 16 and the hardware peripheral device 10. This test controller 18 may have the form of a verification tool or validation test bench. As well as providing appropriate hardware stimuli, such as hardware test vectors, such a test controller 18 may also provide software stimuli to the instruction set simulator 16. The hardware stimuli may be provided in the form of an external verification component 20, such as may for example model the smartcard hardware stimuli referred to in FIG. 1. The software stimuli may be provided by the test controller as a test scenario 22 which serves to generate appropriate API calls to the software driver 8 as well as coordinating these calls with associated hardware stimuli. A conformance and coverage element 24 within the test controller 18 serves to monitor the stimuli applied to and responses of both the software driver 8 and the hardware peripheral device 10 to ensure that these conform with predetermined rules and to monitor the coverage of the range of potential stimuli that may be used in order to ensure an appropriate broad range of stimuli are applied.

Figure 3:
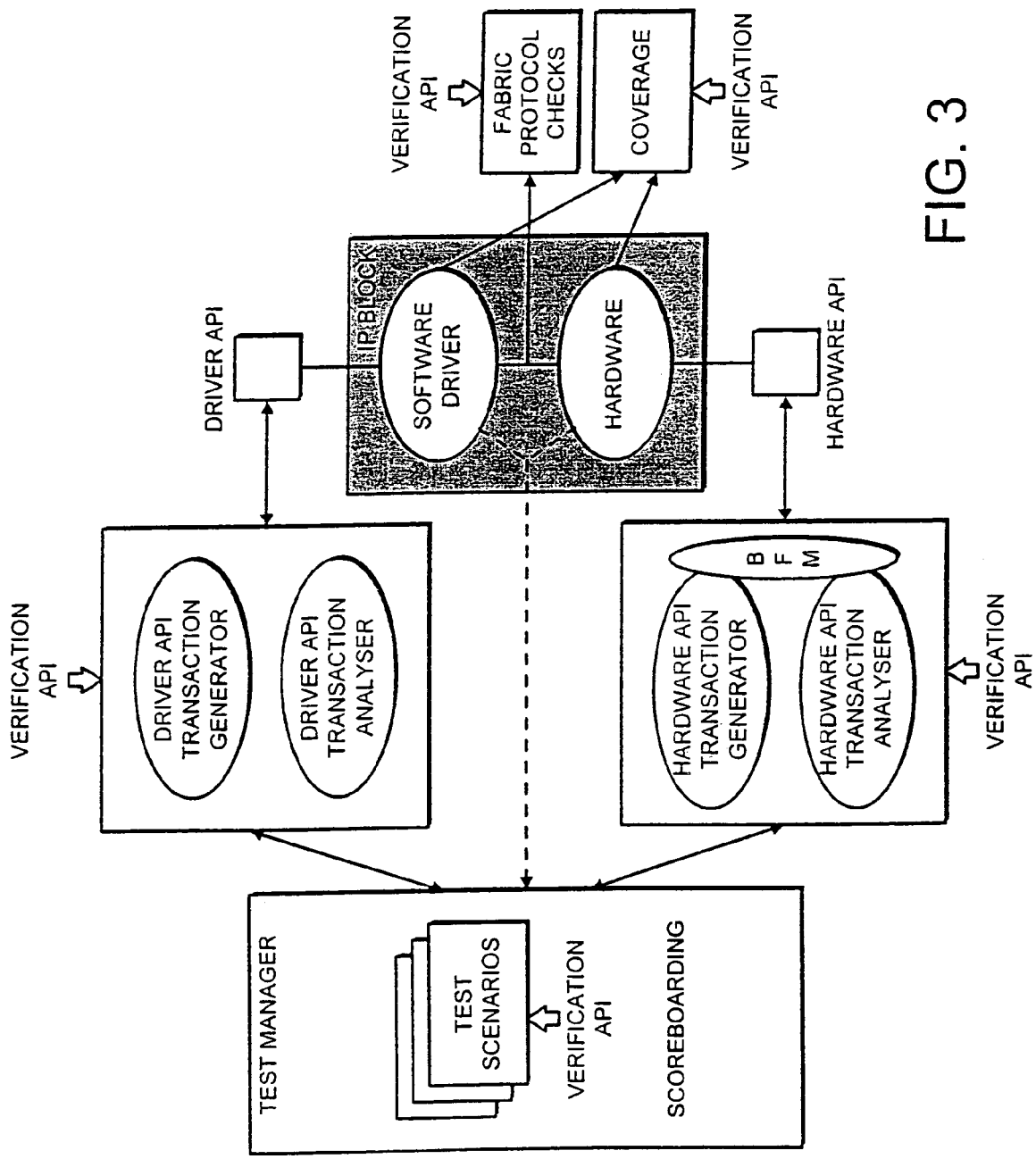
FIG. 3 schematically illustrates an alternative representation of a portion of the simulation environment of FIG. 2.

FIG. 3 shows the proposed verification structure for an IP block. The symmetry emphasizes the equal status of the hardware and software components. Notice that the communication between the software and hardware components is considered to be part of the IP block and as such is not directly driven by the testbench. Instead, it is checked by an interconnection-fabric protocol checker.

The two interfaces to the IP block that are driven by the testbench are the software interface of the driver API and the non-fabric hardware interface to other parts of the system.

A test scenario manager generates stimuli and collects responses from these two interfaces and uses scoreboarding to create self-checking, system level tests.

Both the hardware and software components of the IP block are checked for coverage. This is an important part of the methodology as it allows the user of the IP verification to quantify the coverage of the tests. This, in turn, means that the system validation can be checked for its coverage of a given IP block.

The internal state of the hardware and software components is monitored to measure coverage. The test scenarios can also use the state to verify correct internal behavior during the tests.

The hardware interface is accessed from the test environment via a bus functional model (BFM). This allows the tests to be written at a higher level of modeling, leaving the BFM to add the fine details.

The software interface is accessed from the test environment through the driver's API. This is in contrast to other methodologies where test programs have to be written and run on the co-simulation model in order to exercise the driver.

All the verification components have documented verification interfaces that allow them to be re-used in system tests without needing to know their internal working. For example, the system validation plan may call for a particular test to be performed with a FIFO both full and empty. The verification API and the coverage analysis supplied with the IP block give the appropriate system level facilities to implement this.

An important part of this methodology is the ability to call driver routines from the verification environment. This has been achieved by setting up a remote procedure calling mechanism between the software running on an ARM co-verification model (in Mentor Seamless) and a testbench running on a verification simulator (from Verisity Specman).

Figure 4:
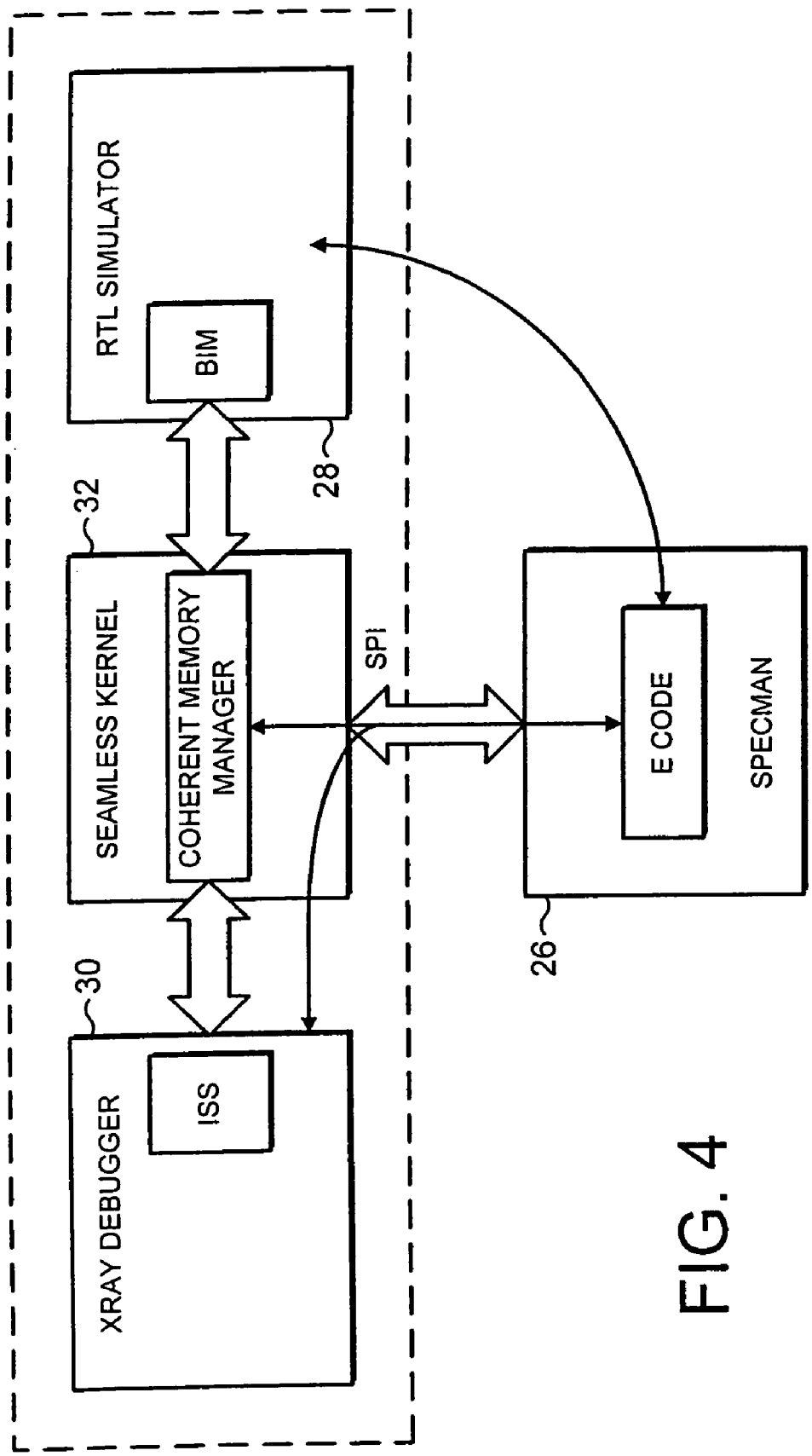
FIG. 4 schematically illustrates a further alternative view of the simulation environment of FIG. 2.

FIG. 4 schematically illustrates an example of the present technique implemented using the Specman and Seamless systems previously discussed. In this figure the test controller is provided by the Specman component 26. The hardware simulator 28 and the software simulator 30 are both provided within the Seamless system. The Seamless system provides a programming interface that may be used by the Specman system 26 to pass appropriate software stimuli to the software simulator 30.

A kernel 32 within the Seamless system provides memory management such that the memory accessible to both the software components and the hardware components may be modelled in a unified manner with appropriate parameters associated with different portions and with the software simulator and hardware simulator reacting to accesses to different memory locations in different ways depending upon what is being simulated and what is represented by that memory.

The link provided between Specman and Seamless gives the ability to read from and write to global variables in the software simulation. It is also possible for methods in the testbench to wait for software variables to change value. This is enough to implement a single threaded remote procedure call (RPC) from an e language testbench to software routines running on the simulator.

Figure 5:
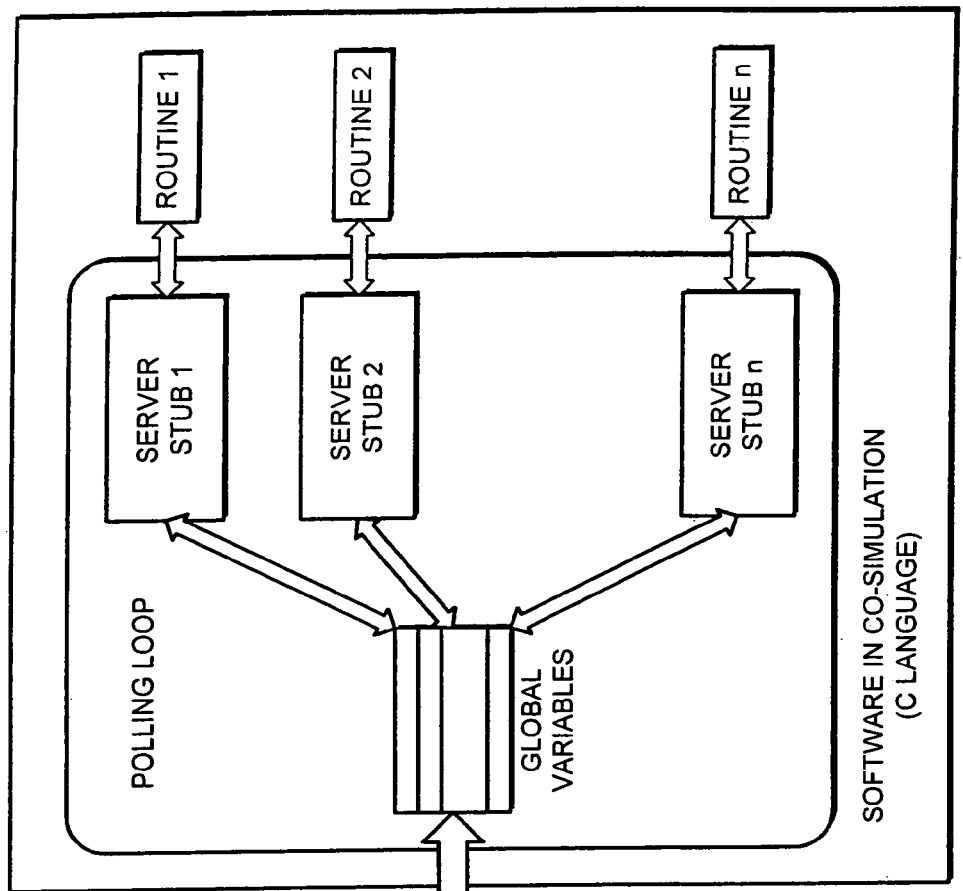
FIG. 5 illustrates an arrangement for allowing a test controller to issue remote procedure calls to a software simulator.
Figure 5:
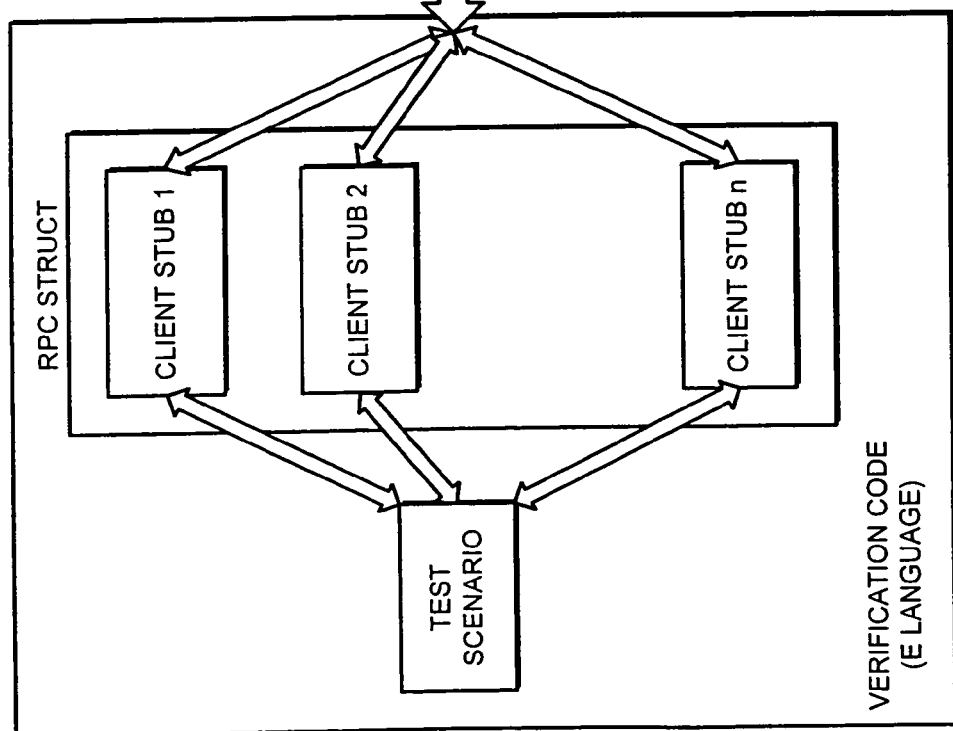

A simple client-server stub implementation is used, see FIG. 5. On the client side, an e language struct is declared that encapsulates the client RPC functionality. The struct's init routine is extended to establish the connection with Seamless while the client stubs are declared as time consuming methods of the struct. Each client stub marshals the parameters and transfers them, along with a routine identifier, to a set of global variables in the software simulation. A further global variable is used to signal the start of the software routine. The client stub then waits for the software routine to signal its completion by resetting the start global variable.

The server side is implemented as a simple polling loop. Just before the loop is entered a global variable is set to signal that the server is ready. This allows the testbench to synchronize with the SoC co-simulation so that the hardware reset can complete along with any bootstrap activity.

The polling loop checks for the "start" global variable to be set (by the client stub) indicating that a routine is to be called. When it is set, a switch statement selects the routine to call with the parameters already cached in global variables. When the routine completes the start global variable is reset and the polling loop resumes.

The mapping between e and the global variables has to be considered. The default transfer size is 32 bits so for types that fit into a single 32-bit word, such as int, bool and char, the default mapping is correct. The connection offers the ability to change the endianness if required.

Multi-word types are transferred as a list of bits and then unpacked into an e structure. In these cases the e definitions must be padded to the correct number of bits to match the alignment in the software simulation.

API Routines that have pointer parameters are handled specially. Matching data areas are set up on the client and server. The client transfers the server data across, modifies it as required and then transfers it back again. The routine can thus be called from the server stub with the pointer to the server data area.

Very often, a driver API makes use of call back routine parameters. This implies a call from the software simulation back into the into the verification code. These are handled by passing the address of a client stub routine on the server. This then uses the same RPC technique to call a routine via a server stub in the verification code.

Once the driver is accessible from the high-level verification language it is possible to write the sort of randomized test that has proven so useful in the hardware context. For example, it is now easy to generate a set of random parameter values for a routine and check its result. Such random parameter values within constrained valid ranges may be automatically generated for the software stimuli by the test coordinator.

Both multi-word parameters and HVL facilities to randomly exercise a driver routine may be used. Normally the results would be checked against the expected values to form a self-checking test.

Figure 6:
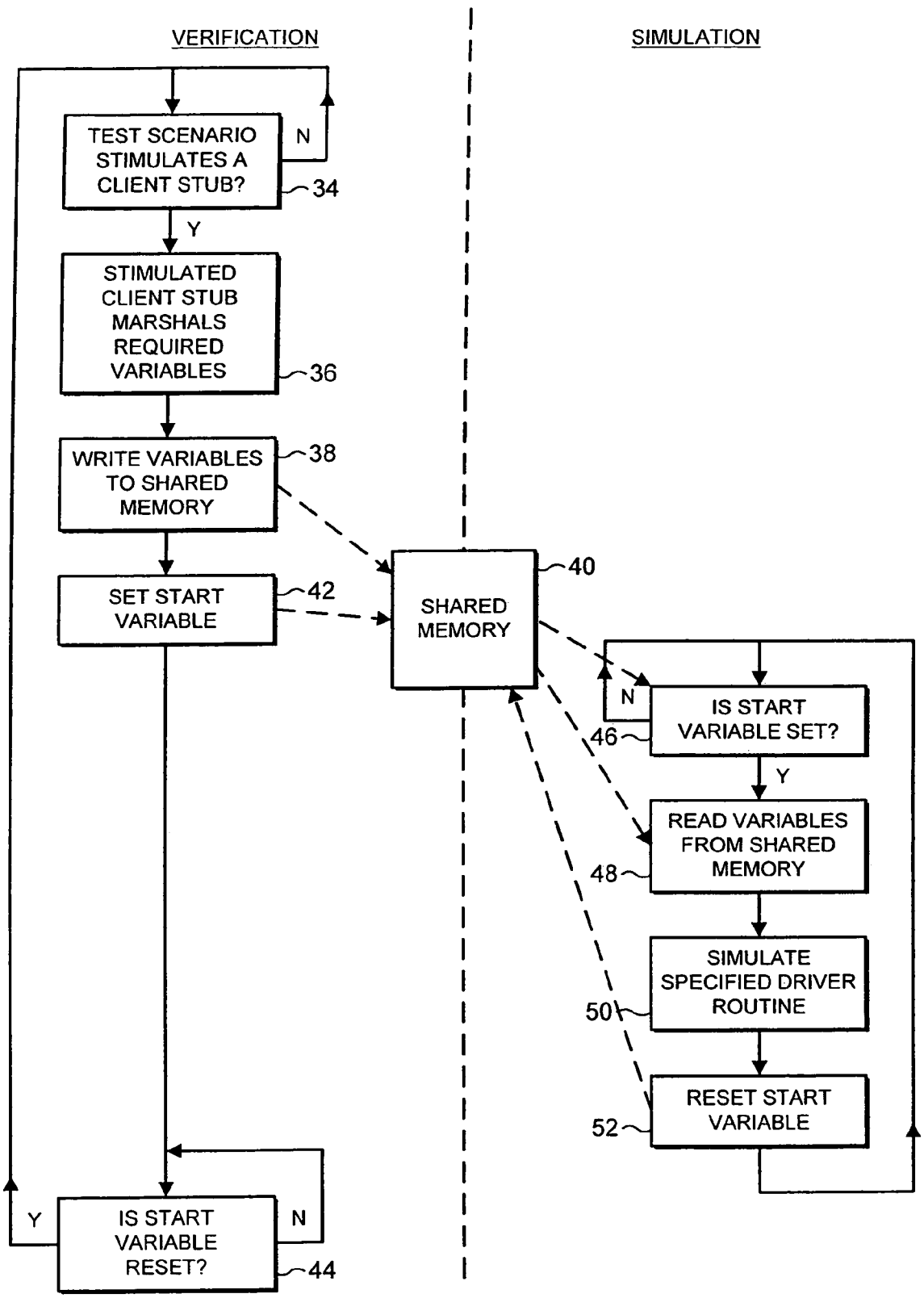
FIG. 6 is a flow diagram illustrating the manner in which a remote procedure call corresponding to a software stimulus may be passed from the verification portion of a system to the simulation portion of a system.

FIG. 6 is a flow diagram schematically illustrating the processing performed within the test controller (verification) portion and the simulation portion when using the remote procedure call technique to pass to a software stimulus.

At step 34, the verification software waits until a test scenario being used stimulates a client stub. When a client stub has been stimulated, then step 36 serves to martial the required variables that need to be passed to the software driver concerned. At step 38 the variables to be passed are written to a shared memory 40. Once this set up is complete, step 42 serves to set a start flag within the shared memory 40 to indicate that a software stimulus for the software simulator is pending and needs to be serviced. Processing within the test controller continues at step 44 waiting for the start flag to be reset before returning to step 34.

Within the simulation software a polling loop serves to monitor the start flag using step to detect when it is set. When the start flag is set, step 48 reads the associated variables from within the shared memory 40 and then the software stimulus specified is simulated at step 50 using the instruction set simulator and associated driver software. When this is complete, step 52 resets the start flag and processing on the simulation side returns to step 46.

The co-simulation environment may be provided by Mentor Seamless CVE, which contains an ARM co-verification model, and by Mentor ModelSim VHDL simulator. Verisity Specman Elite may provide the verification environment (test controller) with links to both the HDL simulation and the software running on the ARM co-verification model. The link to the software is available in Specman Elite version 3.3 and Seamless CVE version 4.0. It is a key enabling technology for this methodology.

Figure 7:
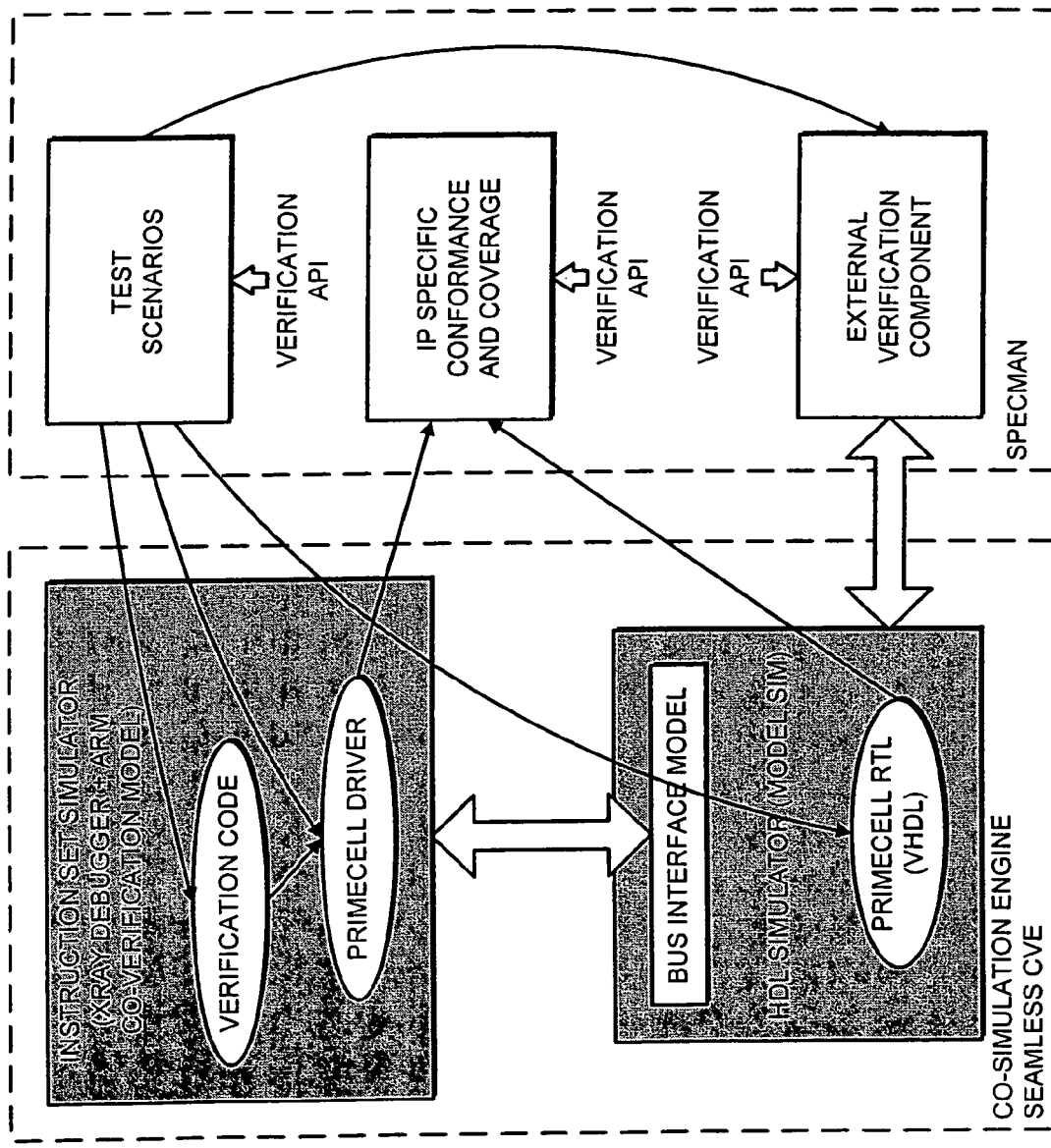
FIG. 7 is another representation of the simulation environment.

The mapping of the verification structure onto these tools is shown in FIG. 7. Seamless supports the simulators to animate the software and hardware components of the IP block. The software is run on the cycle accurate instruction set simulator (an ARM co-verification model) whilst the ModelSim VHDL simulator animates the hardware component. Communication between the two simulators is mediated by the Seamless CVE co-simulation kernel and a bus interface model.

The verification components and test manager are implemented in the e language supported by Specman Elite.

Figure 8:
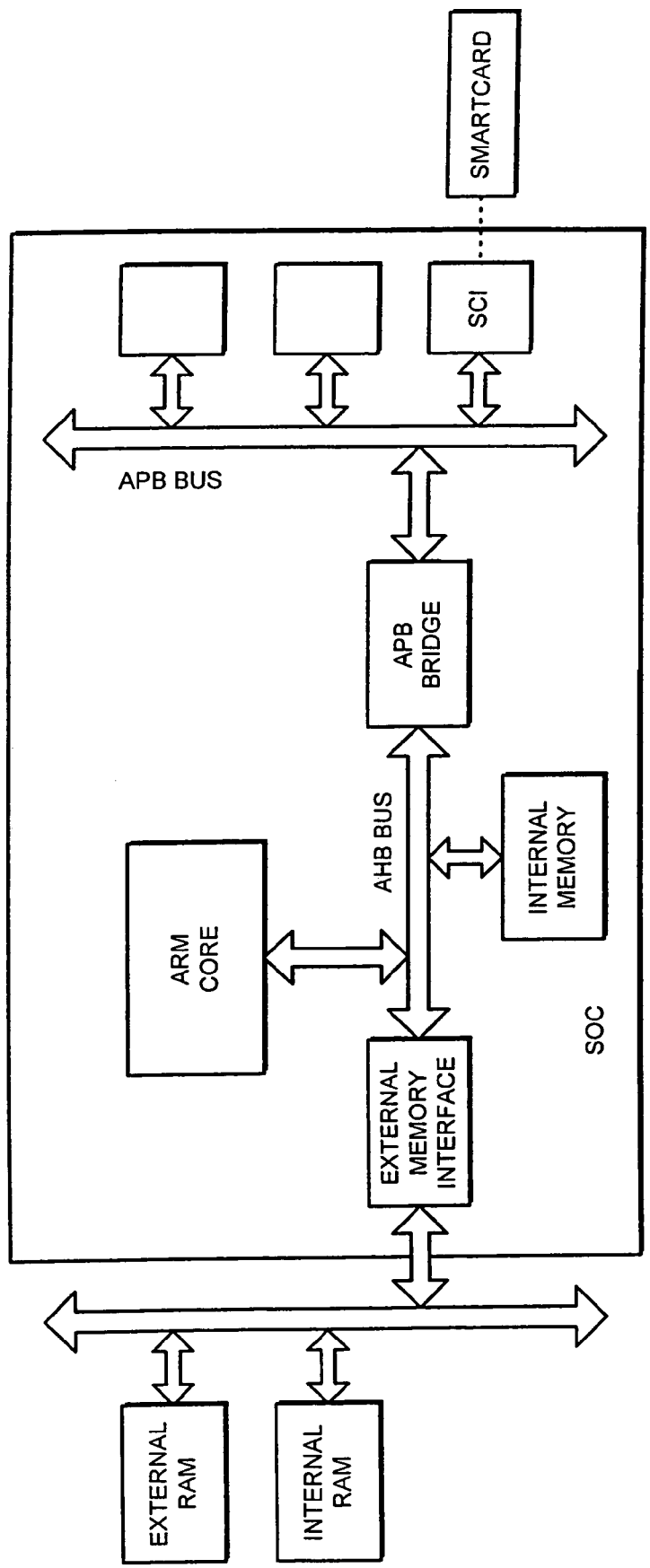
FIG. 8 schematically represents a typical SoC structure with which the present techniques may be used.

A SmartCard Interface PrimeCell may be incorporated into a typical SoC structure as shown in FIG. 8. This was based on the AHB/APB VHDL testbench supplied as part of MicroPack 2.0[1]. For the SmartCard Interface example, a smartcard bus functional model may be written to give verification access to the hardware API. It is advantageous that an object-oriented language, such as e, is used for implementation as it allows the verification components to be safely modified to meet the needs of a particular test or system. For example, a smartcard may need to support a specialized encryption algorithm. With object-oriented techniques (extend in the case of e) this can be easily layered on top of the basic functionality provided with the original verification component.

With the verification structure in place, a number of test scenarios may be implemented to use the new methodology. These may be coded as extensions to the appropriate verification components. A good example is the initial card activation sequence, taking the card as far as the Answer to Reset (ATR) response. This demonstrates the ability to use the full driver API from the verification environment.

First the driver is initialized and then the test waits for the driver to callback when the card is inserted. Meanwhile, the card verification component has been configured (using constraints) to insert at a certain time, to send an ATR after coming out of reset, and finally to remove the card at some later time. The ATR is randomly generated using the constrained generation facilities of the e language.

When the driver calls back to indicate that the card has been inserted, the driver API is called to activate the card. Then, the test waits for the ATR to complete (another callback) when it can compare the ATR sent by the card with the ATR received by the driver.

A variation of this test, where the card is removed part way through the ATR, is easily implemented by just changing the card component's removal time.

Another example test activates the card, writes to the card and then reconciles the data that arrives at the card with the data sent from the testbench.

These tests demonstrate that this methodology provides full end-to-end checking of an IP block from the software driver's API through to the pin interface of the hardware.

Figure 9:
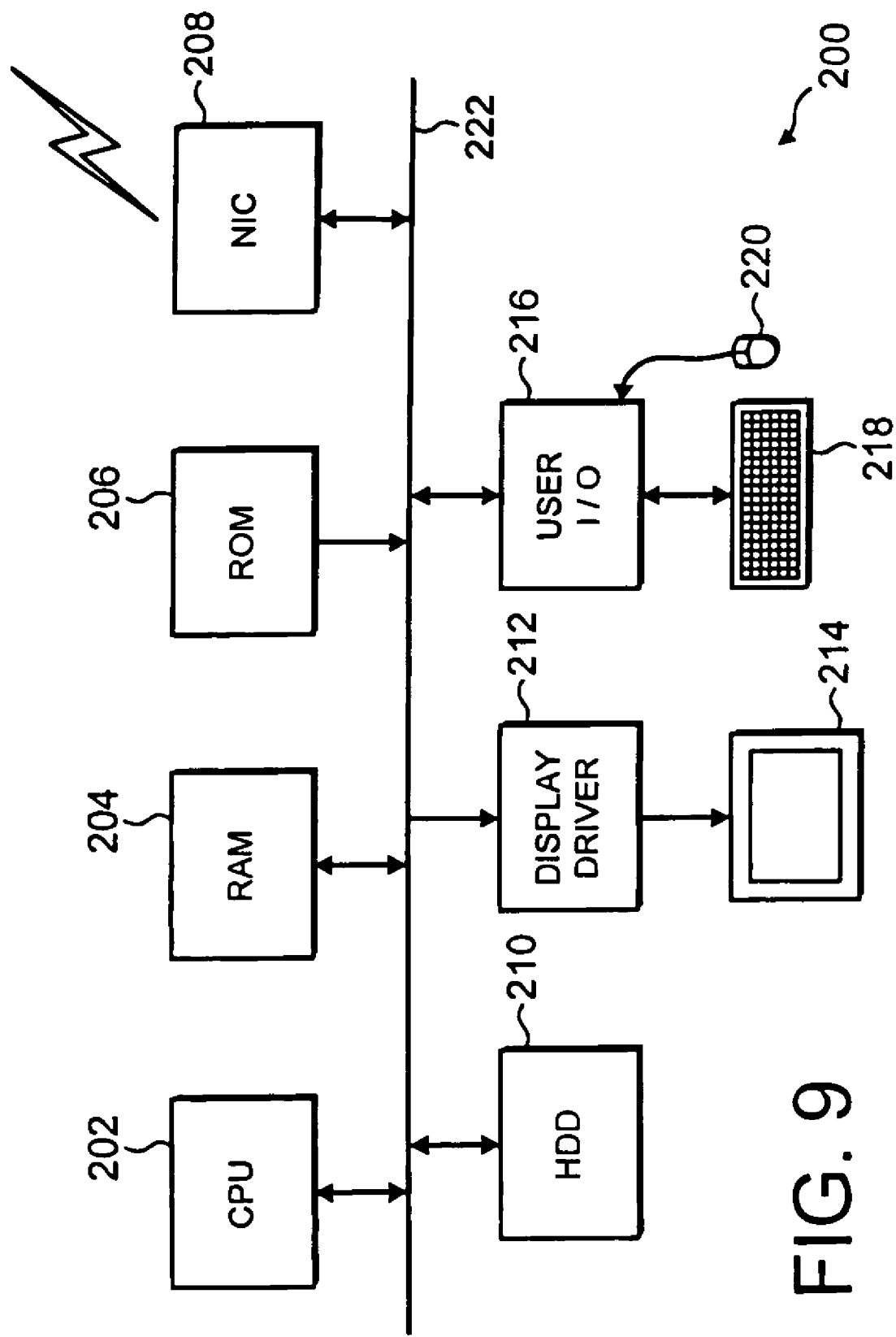
FIG. 9 schematically illustrates a general purpose computer of the type that may be used to implement the above described techniques.

FIG. 9 schematically illustrates a general purpose computer 200 of the type that may be used to implement the above described techniques. The general purpose computer 200 includes a central processing unit 202, a random access memory 204, a read only memory 206, a network interface card 208, a hard disk drive 210, a display driver 212 and monitor 214 and a user input/output circuit 216 with a keyboard 218 and mouse 220 all connected via a common bus 222. In operation the central processing unit 202 will execute computer program instructions that may be stored in one or more of the random access memory 204, the read only memory 206 and the hard disk drive 210 or dynamically downloaded via the network interface card 208. The results of the processing performed may be displayed to a user via the display driver 212 and the monitor 214. User inputs for controlling the operation of the general purpose computer 200 may be received via the user input output circuit 216 from the keyboard 218 or the mouse 220. It will be appreciated that the computer program could be written in a variety of different computer languages. The computer program may be stored and distributed on a recording medium or dynamically downloaded to the general purpose computer 200. When operating under control of an appropriate computer program, the general purpose computer 200 can perform the above described techniques and can be considered to form an apparatus for performing the above described technique. The architecture of the general purpose computer 200 could vary considerably and FIG. 9 is only one example, e.g. a server may not have a screen and a mouse or keyboard.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A method of simulating a system having a software component and a hardware component, said method comprising the steps of:
   (i) modelling operation of said software component using a software simulator;
   (ii) modelling operation of said hardware component using a hardware simulator;
   (iii) linking said hardware simulator and said software simulator to model interaction between said modelled operation of said hardware component and said modelled operation of said software component;
   (iv) generating with a test controller, during said modelling of software and hardware components and said interaction, a software stimulus for said software component and a hardware stimulus for said hardware component, said software stimulus and said hardware stimulus are associated so as to permit verification of correct interoperability of said software component and said hardware component, wherein said modelled interaction between said software component and said hardware component proceeds independently of said test controller;
   (v) modelling the response of said software component to said software stimulus; and
   (vi) modelling the response of said hardware component to said hardware stimulus, wherein said software stimulus is passed to said software simulator by issuing a remote procedure call from said test controller to said software simulator.

2. A method as claimed in claim 1, wherein said test controller issues said remote procedure call by writing call data specifying said software stimulus to a shared memory, said software simulator reading call data from said shared memory to trigger modelling of operation of said software component in response to said software stimulus.

3. A method as claimed in claim 2, wherein said test controller sets a start flag within said shared memory to indicate to said software simulator that said shared memory contains call data specifying a software stimulus to be modelled.

4. A method as claimed in claim 3, wherein said software simulator polls said start flag to determine if there is a software stimulus to be modelled.

5. A method as claimed in claim 3, wherein said software simulator resets said start flag to indicate to said test controller that modelling of said software stimulus has been completed.

6. A method as claimed in claim 2, wherein said call data includes one or more of:
   (i) data identifying a software routine to be modelled within said software component; and
   (ii) variable data to be used in responding to said software stimulus.

7. A method as claimed in claim 1, wherein said hardware component is a hardware peripheral within a data processing system.

8. A method as claimed in claim 1, wherein said software component is a software driver for said hardware component.

9. A method as claimed in claim 1, further comprising monitoring modelled signals at an interface with said hardware component that are generated in response to simulation of said software component and said hardware component.

10. A method as claimed in claim 9, wherein said modelled signals are monitored for compliance with rules defining permitted values for said modelled signals.

11. A method as claimed in claim 1, wherein said software simulator is monitored to determine coverage of a range of software stimuli that may be applied to said software simulator.

12. A method as claimed in claim 1, wherein said hardware simulator is monitored to determine coverage of a range of hardware stimuli that may be applied to said hardware simulator.

13. A method as claimed in claim 1, wherein said software simulator is an instruction set simulator that serves to model execution of software program instruction by a data processing core.

14. A method as claimed in claim 1, further comprising monitoring said hardware simulator to detect expected changes of state within said hardware component occurring in response to said software stimulus.

15. Apparatus for simulating a system having a software component and a hardware component, said apparatus comprising:
- (i) a software simulator for modelling operation of said software component;
- (ii) a hardware simulator for modelling operation of said hardware component
- (iii) means for linking said hardware simulator and said software simulator to model interaction between said modelled operation of said hardware component and said modelled operation of said software component;
- (iv) a test controller for generating, during modelling of said software and hardware components and said interaction, a software stimulus for said software component and a hardware stimulus for said hardware component, said software stimulus and said hardware stimulus are associated so as to permit verification of correct interoperability of said software component and said hardware component, wherein said modelled interaction between said software component and said hardware component proceeds independently of said test cntroller;
- (v) said software simulator includes means for modelling a response of said software component to said software stimulus; and
- (vi) said hardware simulator includes means for modelling a response of said hardware component to said hardware stimulus, wherein said software stimulus is passed to said software simulator by issuing a remote procedure call from said test controller to said software simulator.

16. A computer program product comprising a computer-readable medium for controlling a computer to simulate a system having a software component and a hardware component, said computer program product comprising:
- (i) software simulator logic for modelling operation of said software component;
- (ii) hardware simulator logic for modelling operation of said hardware component
- (iii) logic linking said hardware simulator logic and said software simulator logic to model interaction between said operation of said hardware component and saiod modelled operation of said software component;
- (iv) test controller logic for generating a software stimulus for said software component and a hardware stimulus for said hardware component, said generating occurring during modelling of said software component and said hardware component and said modelled interaction, said software stimulus and said hardware stimulus being associated so as to permit verification of correct interoperability of said software component and said hardware component, wherein said interaction between said software component and said hardware component proceeds independently of said test controller logic;
- (v) said software simulator logic includes logic for modelling a response of said software component to said software stimulus; and
- (vi) said hardware simulator logic includes logic for modelling a response of said hardware component to said hardware stimulus, wherein said software stimulus is passed to said software simulator logic by issuing a remote procedure call from said test controller logic to said software simulator logic.

* * * * *